(12) United States Patent
Iwase

(10) Patent No.: US 6,697,285 B2
(45) Date of Patent: Feb. 24, 2004

(54) SEMICONDUCTOR MEMORY DEVICE

(75) Inventor: Taira Iwase, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 10/016,737

(22) Filed: Oct. 30, 2001

(65) Prior Publication Data

US 2002/0131305 A1 Sep. 19, 2002

(30) Foreign Application Priority Data

Mar. 13, 2001 (JP) ........................................ 2001-071106

(51) Int. Cl.[7] .............................................. G11C 16/04
(52) U.S. Cl. ................... 365/189.05; 365/201; 365/220
(58) Field of Search ........................... 365/189.05, 220, 365/230.08, 201, 189.12, 233.5

(56) References Cited

U.S. PATENT DOCUMENTS 5,751,645 A * 5/1998 Tsukikawa ................. 365/194
6,577,534 B2 * 6/2003 Tsuruda .................. 365/185.09
6,577,551 B2 * 6/2003 Ito et al. .................. 365/225.7

FOREIGN PATENT DOCUMENTS

JP P2000-11695 A 1/2000

* cited by examiner

*Primary Examiner*—Richard Elms
*Assistant Examiner*—Hien Nguyen
(74) *Attorney, Agent, or Firm*—Frommer Lawrence & Haug LLP

(57) ABSTRACT

The semiconductor memory device comprises a plurality of data output terminals outputting in parallel data of a plurality of bits, the number of bits being a plurality of times as large as the number of the plurality of data output terminals, an address transition detecting circuit to output a latch control signal, and an output control circuit for performing a switching control on the basis of a switching signal such that the data read in parallel in each read cycle is held by a latch circuit, and the data held by the latch circuit is divided by a plural number and one group of the divided data is outputted to the plurality of data output terminals during the cycle, with the remaining group of divided data being outputted to the plurality of data output terminals during the next read cycle.

34 Claims, 3 Drawing Sheets

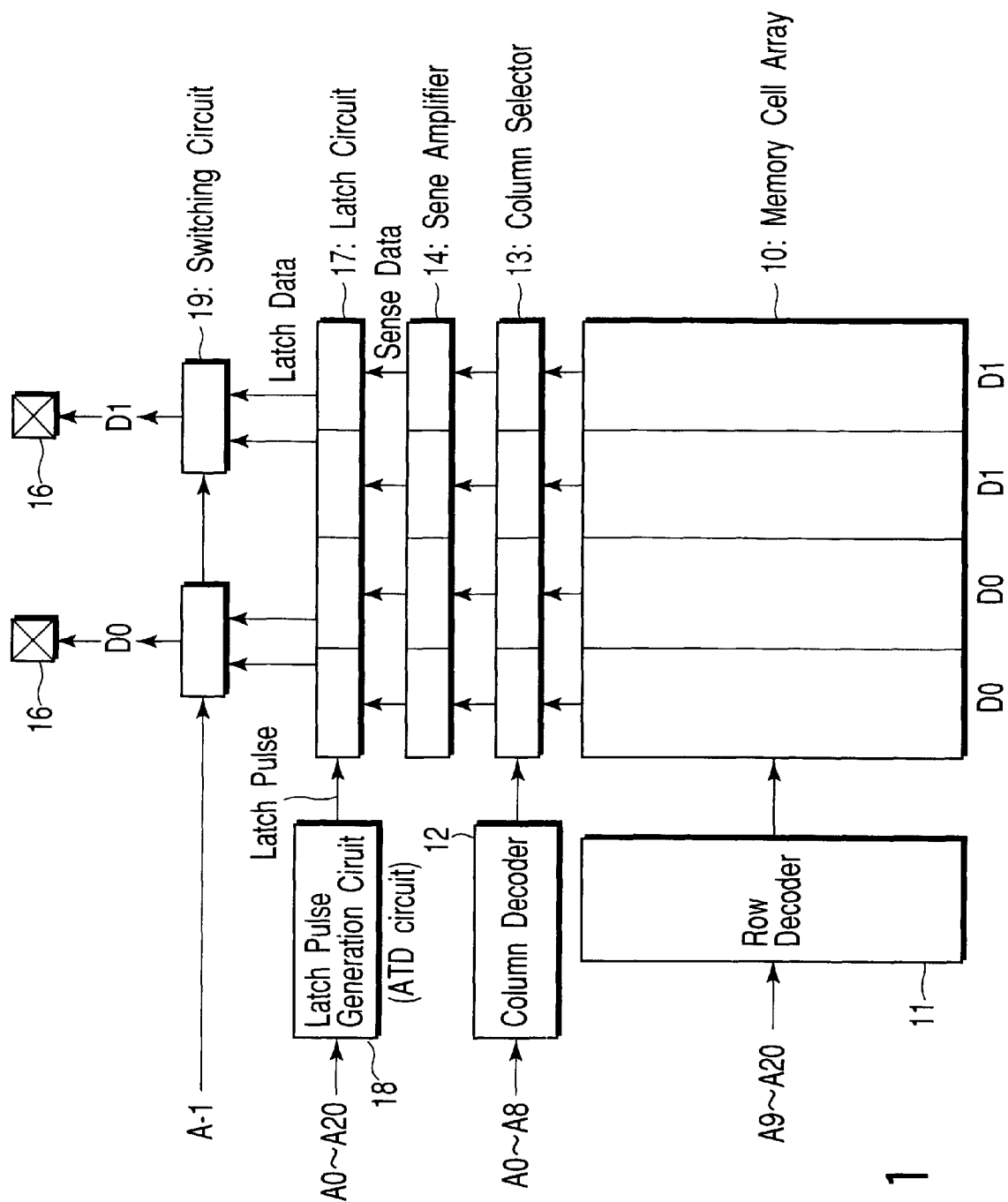
F I G. 1

SEMICONDUCTOR MEMORY DEVICE

CROSS-REFERENCE TO RELATED APPLICATIONS

This application is based upon and claims the benefit of priority from the prior Japanese Patent Application No. 2001-071106, filed Mar. 13, 2001, the entire contents of which are incorporated herein by reference.

BACKGROUND OF THE INVENTION

1. Field of the Invention

The present invention relates to a semiconductor memory device, particularly, to a data output circuit section of a semiconductor memory, which is used in, for example, a ROM (Read Only Memory).

2. Description of the Related Art

In recent years, the memory capacity of the semiconductor memory is made greater and greater. In this connection, the test time of the semiconductor memory is made very long, with the result that it is very important to shorten the test time. For shortening the test time, required is an improvement in the rate of data read denoting how much data can be read in a predetermined time. In the conventional semiconductor memory, however, no particular measure was taken for improving the rate of data read in the semiconductor memory device itself.

Disclosed in Japanese Patent Disclosure (Kokai) No. 2000-11695 is a semiconductor memory device provided with a built-in parallel test circuit. It is taught that an internal clock signal is prepared from an external clock signal in a wafer test operation mode so as to output two groups of data in synchronism with the internal clock signal. However, the compatibility with a general purpose memory and the application to the test under the packaged state are not referred to at all in this prior art.

As described above, the conventional semiconductor memory device gives rise to the problem that no measure is taken for improving the rate of data read for shortening the test time.

An object of the present invention, which is intended to overcome the above-noted problem inherent in the prior art, is to provide a semiconductor memory device capable of improving the rate of data read or the rate of data write so as to shorten the time required for the test while maintaining the compatibility with the general purpose memory and without increasing the number of external terminals.

BRIEF SUMMARY OF THE INVENTION

According to a first aspect of the present invention, there is provided a semiconductor memory device, comprising a memory cell array; a plurality of data output terminals for outputting in parallel data of a plurality of bits; a latch circuit arranged between the memory cell array and the plural data output terminals; a read control circuit for reading in parallel from the memory cell array data of bits, the number of the bits being a plurality of times as large as the number of the plural data output terminals; an address transition detecting circuit for detecting the transition of an address signal for outputting a latch control signal; and an output control circuit for performing a switching control on the basis of a switching signal such that the data read in parallel from the memory cell array in each read cycle is held by the latch circuit in accordance with the latch control signal, and the data held by the latch circuit is divided by a plural number and one group of the divided data is outputted to the plural data output terminals during the cycle, with the remaining group of divided data being outputted to the plural data output terminals during a predetermined period of the next read cycle.

According to a second aspect of the present invention, there is provided a semiconductor memory device, comprising a memory cell array; a plurality of data output terminals for outputting in parallel data of a plurality of bits; a latch circuit arranged between the memory cell array and the plural data output terminals; a read control circuit for reading in parallel from the memory cell array data of bits, the number of the bits being a plurality of times as large as the number of the plural data output terminals; an address transition detecting circuit for detecting the transition of an address signal for outputting a latch control signal; and an output control circuit for performing a switching control on the basis of a switching signal such that the data read in parallel from the memory cell array in each read cycle during the normal operation and during the test operation is held by the latch circuit in accordance with the latch control signal, and the data held by the latch circuit is divided by a plural number and the divided groups of data are outputted group by group to the plural data output terminals during a predetermined period of the next read cycle.

Further, according to a third aspect of the present invention, there is provided a semiconductor memory device, comprising a memory cell array; a plurality of data output terminals for outputting in parallel data of a plurality of bits; a latch circuit arranged between the memory cell array and the plural data output terminals; a read control circuit for reading in parallel from the plural memory cell array data of bits, the number of the bits being a plurality of times as large as the number of the plural data output terminals; an address transition detecting circuit for detecting the transition of an address signal for outputting a latch control signal; and an output control circuit for performing a switching control on the basis of a switching signal such that the data read in parallel from the memory cell array in each read cycle is held by the latch circuit in accordance with the latch control signal, and the data held by the latch circuit is divided by a plural number, one group of the divided data being outputted to the plural data output terminals during the cycle and the remaining group of data being outputted to the plural data output terminals during a predetermined period of the next cycle during normal operation, and the divided groups of data being outputted group by group to the plural data output terminals during a predetermined period of the next read cycle during the test operation.

BRIEF DESCRIPTION OF THE SEVERAL VIEWS OF THE DRAWING

FIG. 1 is a block diagram showing a part of a ROM according to a first embodiment of the present invention;

DETAILED DESCRIPTION OF THE INVENTION

Figure 2:
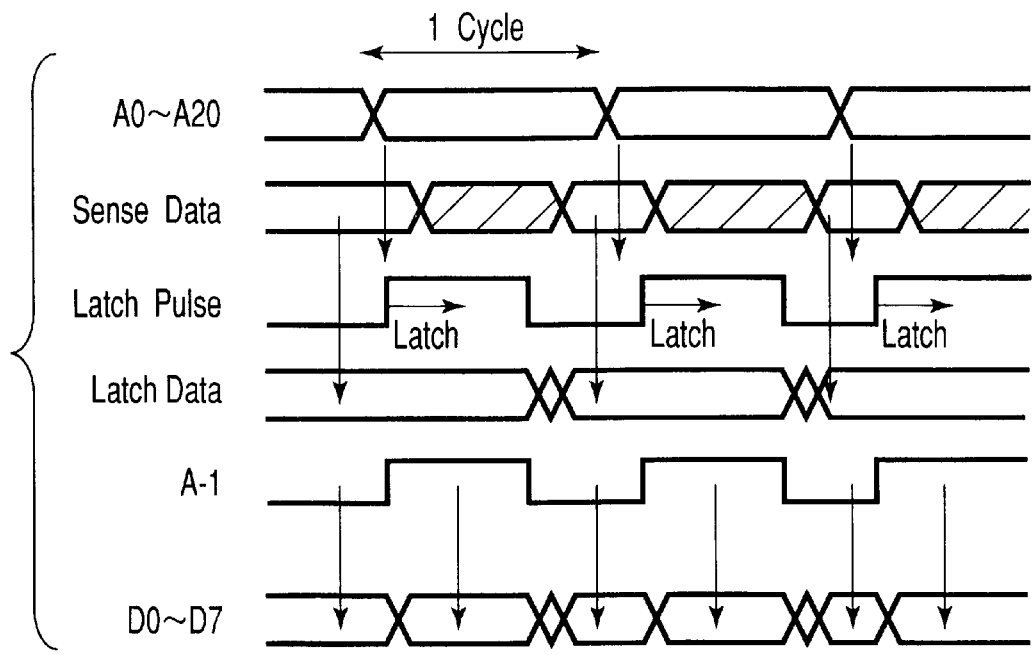
FIG. 2 is a timing diagram exemplifying the read operation of the ROM shown in FIG. 1.

Some embodiments of the present invention will now be described in detail with reference to the accompanying drawings.

First Embodiment

FIG. 1 is a block diagram showing a part of a ROM according to a first embodiment of the present invention. The ROM shown in FIG. 1 has a memory capacity of, for example, 32 megabits and the output is formed of 8 bits of, for example, D0 to D7. As shown in the drawing, the ROM comprises a memory cell array 10, a row decoder 11 supplied with row address signals A9 to A20 for performing the row selection of the memory cell array 10, a column decoder 12 supplied with column address signals A0 to A8, a column selector 13 subjected to the switching control by the column decoder 12 for performing the column selection of the memory cell array 10, and a sense amplifier 14 for sense-amplifying the data read from the memory cell array 10 via the column selector 13.

The read control circuit including the row decoder 11, the column decoder 12, the column selector 13 and the sense amplifier 14 performs the function of reading in parallel the data of bits (16 bits) twice as large as the number of bits of the output from the memory cell array 10.

The ROM shown in FIG. 1 also comprises a plurality of data output terminals 16 for outputting in parallel the data D0 to D7 each formed of a plurality of bits. For simplicity of the diagram, data D0 and D1 alone formed of two bits are shown in the drawing. Also, only two data output terminals 16 are shown in the drawing for simplicity of the diagram.

The ROM shown in FIG. 1 also comprises a latch circuit 17 arranged between the memory cell array 10 and the plural data output terminals 16 and supplied with the sense data output of the sense amplifier 14 and a latch pulse generation circuit 18 for forming a latch pulse serving to control the operation of the latch circuit 17. In the latch pulse generation circuit 18, the transition of an address signal is detected by an ATD (Address Transition Detecting) circuit so as to form an ATD signal and a latch pulse is generated in synchronism with the transition of the address signal.

The ROM shown in FIG. 1 also comprises a switching circuit 19, which is controlled such that the data held by the latch circuit 17 is switched on the basis of a switching signal so as to be outputted to the plural data output terminals 16. In the first embodiment of the present invention, an address signal A-1, which is one of the external address signals, is used as the switching signal noted above.

The output control circuit including the latch pulse generation circuit 18, the latch circuit 17 and the switching circuit 19 performs the function of a switching control on the basis of a switching signal such that the data read in parallel from the memory cell array 10 in each read cycle is held and is divided by a plural number. One group of the divided data, i.e., half the data in this embodiment, is outputted to the plural data output terminals 16 during said cycle, and the remaining group of data is outputted to the plural data output terminals during a predetermined period of the next read cycle. In other words, the output control circuit performs the function of holding the data read from the memory cell array 10 in the previous operation cycle for a predetermined period of time in the next operation cycle and the function of switching the read data for every 8 bits so as to be outputted to the output terminal 16.

FIG. 2 is a timing diagram exemplifying the read operation of the ROM shown in FIG. 1.

The data of 16 bits read from the memory cell array 10 in each read cycle are held by the latch circuit, and the data of 8 bits among the data of 16 bits held by the latch circuit is outputted to the output terminal through the switching circuit during said cycle on the basis of the control performed by the address signal A-1.

Then, the data of the remaining 8 bits held by the latch circuit in the previous read cycle is outputted to the output terminal through the switching circuit on the basis of the switching control performed by the address signal A-1 in a predetermined period (generally, in the initial period) of the next read cycle. It should be noted that, since the held data is supplied to a point immediately before the output terminal, the time for the read operation of the data is sufficiently short. In general, the time for the read operation is not longer than half the cycle time.

It should also be noted that, during the operation cycle for reading the held data, the operation to read the data from the newly selected memory cell array is being carried out. In this case, the data read from the memory cell array in each read cycle is held for a predetermined period of time in the next read cycle. It follows that the operation to output the held data to the output terminal and the read operation from the newly selected memory cell array can be performed in parallel quite independently.

Because of the particular read operation, the read operation can be performed at a data read rate twice as high as the rate for the ordinary read operation. If this merit is utilized for the test, the test output data can be read at a data read rate twice as high as the rate for the ordinary read operation so as to shorten the test time to a half. It should also be noted that the data of 8 bits, which is outputted first, of the read data of 16 bits read from the memory cell array in each cycle is quite free from delay in the access time.

In other words, during the ordinary operation, the data outputted to the outside from the output terminal in the initial period of each operation cycle is invalid. In the test operation, however, the data is outputted even during the invalid period so as to make it possible to shorten the test time.

As described above, the ROM according to the first embodiment of the present invention makes it possible to read the test output data at a data read rate twice as high as the rate for the ordinary read operation in each of the wafer state and the packaged state while maintaining the compatibility with the general purpose ROM and without impairing at all the function of the ordinary general purpose ROM. It follows that the test time can be shortened to a half.

What should also be noted is that the data of 16 bits read from the memory cell array is divided into two groups of data, and these divided two groups of data can be outputted on the time division basis from a single output terminal via a switching circuit (not shown) so as to make it unnecessary to use a special terminal.

Incidentally, the ROM of the first embodiment is directed to the case where the internal operation is controlled by an address access mode tACC, which is most fundamental in the general purpose ROM. However, the technical idea of the present invention is also applicable in accordance with the tACC mode to the case where the internal operation is controlled by a chip enable access mode tCE in which the switching control is performed by a chip enable signal CE.

Further, in the first embodiment of the present invention, the number of bits read in parallel is twice as large as the number of bits of the output. If the number of bits read out is 4 times or 8 times as large as the number of bits of the output, the read rate is clearly 4 times or 8 times as large.

Second Embodiment

In the ROM according to the first embodiment of the present invention described above, a part of the data read from the memory cell array in each read cycle and held by a latch circuit is read to the output terminal, and the remaining data held by the latch circuit is read to the output terminal in the next operation cycle, with the result that it is necessary to take the delay of the data in the latch circuit into consideration. The ROM according to a second embodiment of the present invention, however, makes it unnecessary to take the delay into consideration.

Figure 3:
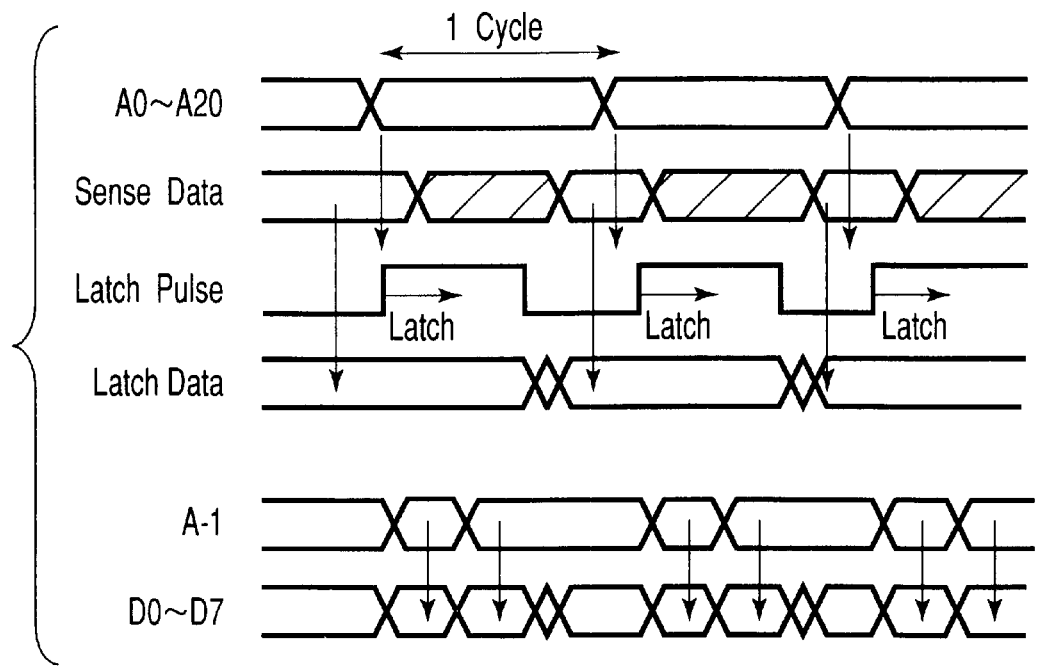
FIG. 3 is a timing diagram exemplifying the read operation of a ROM according to a second embodiment of the present invention.

FIG. 3 is a timing diagram exemplifying the read operation of the ROM according to the second embodiment of the present invention.

As apparent from the example of the read operation shown in FIG. 3, the ROM according to the second embodiment of the present invention, which is equal in its basic operation to the ROM according to the first embodiment, differs from the first embodiment in that the ROM is controlled to repeat the operation of allowing the data read from the memory cell array in each read cycle to be held by a latch circuit and the operation of twice switching the held data by the address signal A-1 and reading the held data to the output terminal through a switching circuit in the next read cycle.

In the ROM according to the second embodiment of the present invention, it suffices for the data read from the memory cell array in each read cycle to be transmitted to the latch circuit without being read to the output terminal. In other words, it is unnecessary to take into consideration the delay of data in the latch circuit as in the case where the read data is outputted as it is to the output terminal through the latch circuit. It follows that the ROM can be operated in a cycle time shorter than that of the ROM according to the first embodiment of the present invention.

In this case, the data shifted by one operation cycle is outputted from the output terminal. However, the ROM of the second embodiment clearly produces an effect greater than that produced by the ROM according to the first embodiment of the present invention in that the read rate of the data can be increased.

Modification of Second Embodiment

The ROM of the second embodiment certainly permits improving the data read rate as described above. However, the compatibility with the general purpose ROM is somewhat impaired. It should be noted in this connection that the compatibility with the general purpose ROM can be ensured, if the ROM is operated as in the second embodiment only during the test time and is switched to operate in the timing of the general purpose ROM as in the first embodiment during the normal operation.

Third Embodiment

In the ROM according to each of the first and second embodiments of the present invention described above, the read data is latched by a latch pulse formed by detecting the transition of the address signal within the chip by the ATD circuit. However, it is also possible to construct the ROM such that the read data is latched by an external input pulse. The ROM according to a third embodiment of the present invention is directed to an example of the particular construction.

The ROM of the third embodiment is equal in basic construction and operation to the ROM of the first embodiment, but differs from the ROM of the first embodiment in that the ROM of the third embodiment is constructed such that the data read from the memory cell array in each read cycle is latched by an external input pulse and is retained for a predetermined period in the next operation cycle. Incidentally, the address signal A-1 is used for switching the output data as in the first and second embodiments of the present invention.

Figure 4:
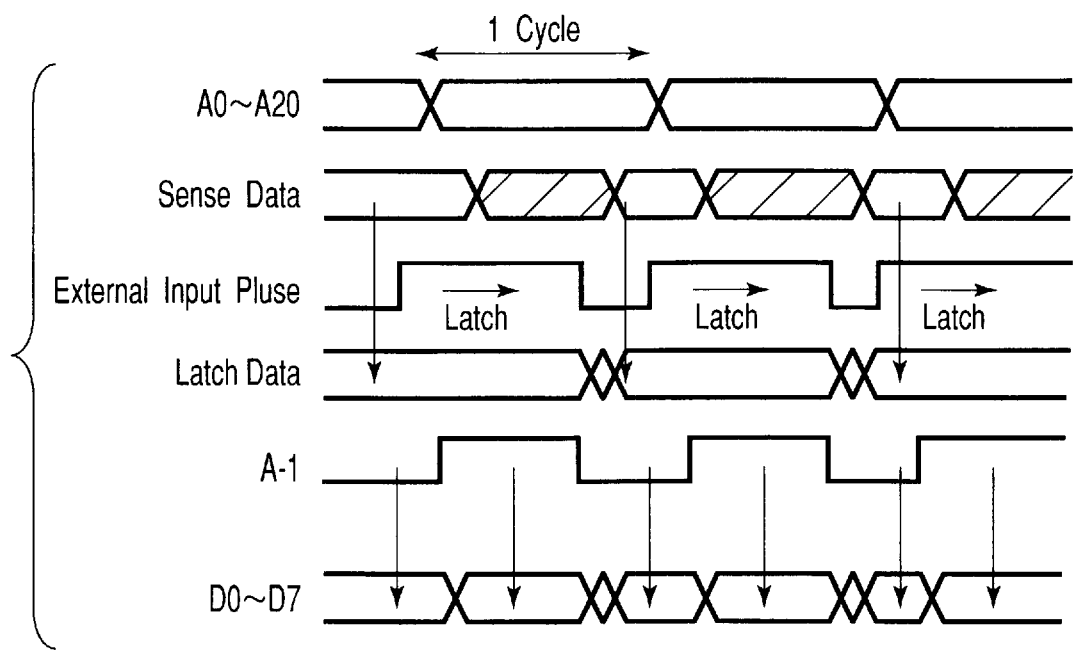
FIG. 4 is a timing diagram exemplifying the read operation of a ROM according to a third embodiment of the present invention.

FIG. 4 is a timing diagram exemplifying the read operation of the ROM according to the third embodiment of the present invention.

As apparent from the example of the read operation shown in FIG. 4, according to the ROM of the third embodiment, the timing of the external input pulse can be set independently of the switching of the address so as to make it possible to set the timing desirable in shortening the test time.

Incidentally, it is possible for the external input pulse to be supplied from an external input terminal (pin) of the ROM or from a test pad arranged within the chip.

Fourth Embodiment

In the ROM according to each of the first to third embodiments of the present invention, the output data was switched by using the address signal A-1 in dividing the data read from the memory cell array into two divided data and outputting the divided data in the time division basis from a single output terminal.

On the other hand, it is also possible to construct the ROM such that the output data is switched by using an external input pulse in place of the address signal A-1. The ROM according to the fourth embodiment of the present invention is directed to the particular construction.

The ROM of the fourth embodiment is equal in its basic construction and operation to the ROM of third embodiment, but differs from the ROM of the third embodiment in that, when the data read from the memory cell array is divided into two, and the divided data is outputted from a single output terminal on the time division basis, the output data is switched by using the external input pulse.

Figure 5:
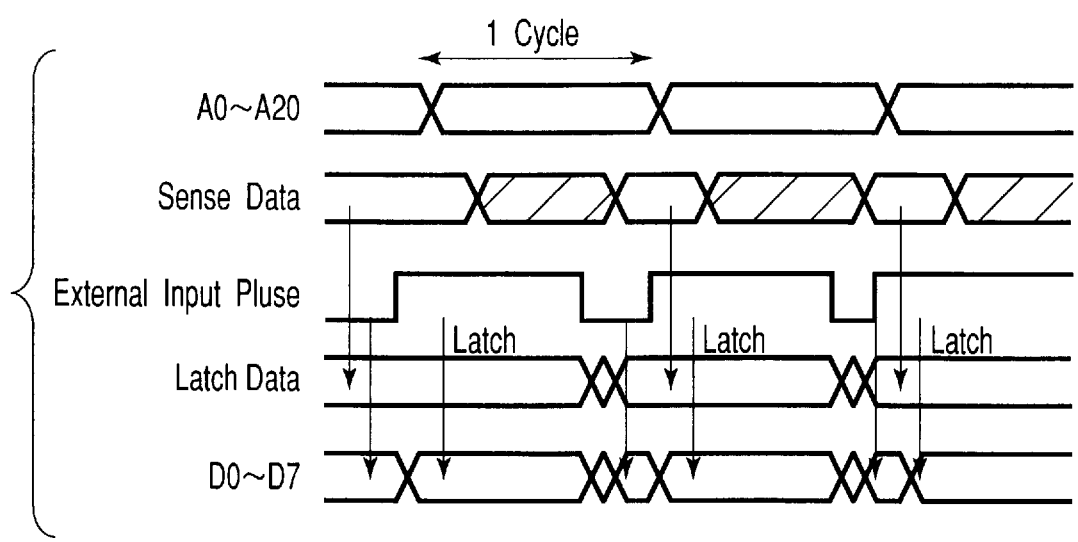
FIG. 5 is a timing diagram exemplifying the read operation of a ROM according to a fourth embodiment of the present invention.

FIG. 5 is a timing diagram exemplifying the read operation of the ROM according to the fourth embodiment of the present invention.

Specifically, in the first step, the corresponding data is read by switching the address and the data is latched by the external input pulse. Also, the output data is switched in accordance with the two logic levels of the external input pulse so as to read the remaining data.

In the ROM according to the fourth embodiment of the present invention, the external input pulse performs both the data latch and the switching of the output data, with the result that it is possible to simplify the circuit construction in the case where the data read from the memory cell array is divided into two divided data and the divided data is outputted on the time division basis from a single output terminal.

Incidentally, the present invention is not limited to the ROM according to each of the embodiments described above. It is possible to apply the technical idea of the present invention to other semiconductor memory devices performing the read operation basically equal to that performed by the ROM described above.

As described above, according to the semiconductor memory device of the present invention, it is possible to improve the data read rate or the data write rate in the test operation while maintaining the compatibility with the general purpose memory without increasing particularly the number of external terminals so as to shorten the test time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
   a memory cell array;
   a plurality of data output terminals for outputting data of a plurality of bits in parallel;
   a latch circuit arranged between said memory cell array and said plurality of data output terminals;
   a read control circuit for reading data of bits in parallel from said memory cell array, the number of said bits being a plurality of times as large as the number of said plurality of data output terminals;
   an address transition detecting circuit for detecting the transition of an address signal for outputting a latch control signal; and
   an output control circuit for performing a switching control of a first mode on the basis of a switching signal such that said data read in parallel from said memory cell array in each read cycle is held by said latch circuit in accordance with said latch control signal, and said data held by said latch circuit is divided by a plural number and one group of the divided data is outputted to said plurality of data output terminals in said read cycle, with the remaining group of divided data being outputted to said plurality of data output terminals in a predetermined period of the next read cycle.

2. The semiconductor memory device according to claim 1, wherein an external input signal is used as said switching signal.

3. The semiconductor device according to claim 1, wherein said output control circuit is switched to the first mode during a test operation.

4. The semiconductor device according to claim 3, wherein said predetermined period of the first mode is a period of invalid data outputs during a normal operation.

5. A semiconductor memory device, comprising:
   a memory cell array;
   a plurality of data output terminals for outputting data of a plurality of bits in parallel;
   a latch circuit arranged between said memory cell array and said plurality of data output terminals;
   a read control circuit for reading data of bits in parallel from said memory cell array, the number of said bits being a plurality of times as large as the number of said plurality of data output terminals;
   an address transition detecting circuit for detecting the transition of an address signal for outputting a latch control signal; and
   an output control circuit for performing a switching control of a first mode on the basis of a switching signal such that said data read in parallel from said memory cell array in each read cycle is held by said latch circuit in accordance with said latch control signal, and said data held by said latch circuit is divided by a plural number and the divided groups of data are outputted group by group to said plurality of data output terminals in the next read cycle.

6. The semiconductor memory device according to claim 5, wherein an external input signal is used as said switching signal.

7. The semiconductor device according to claim 5, wherein said output control circuit is switched to the first mode during a test operation.

8. The semiconductor device according to claim 7, wherein a period of invalid data outputs during a normal operation is included in the next read cycle of the first mode.

9. A semiconductor memory device, comprising:
   a memory cell array;
   a plurality of data output terminals for outputting data of a plurality of bits in parallel;
   a latch circuit arranged between said memory cell array and said plurality of data output terminals;
   a read control circuit for reading data of bits in parallel from said memory cell array, the number of said bits being a plurality of times as large as the number of said plurality of data output terminals;
   an address transition detecting circuit for detecting the transition of an address signal for outputting a latch control signal; and
   an output control circuit for performing a switching control on the basis of a switching signal such that said data read in parallel from said memory cell array in each read cycle is held by said latch circuit in accordance with said latch control signal, and said data held by said latch circuit is divided by a plural number, during a normal operation one group of the divided data being outputted to said plurality of data output terminals in said read cycle and the remaining group of data being outputted to said plurality of data output terminals in a predetermined period of the next read cycle, and during a test operation the divided groups of data being outputted group by group to said plurality of data output terminals in a period of the next read cycle including a period of invalid data outputs in said normal operation.

10. The semiconductor memory device according to claim 9, wherein an external input signal is used as said switching signal.

11. A semiconductor memory device, comprising:
    a memory cell array;
    a plurality of data output terminals for outputting data of a plurality of bits in parallel;
    a latch circuit arranged between said memory cell array and said plurality of data output terminals;
    a read control circuit for reading data of bits in parallel from said memory cell array, the number of said bits being a plurality of times as large as the number of said plurality of data output terminals; and
    an output control circuit for performing a switching control of a first mode on the basis of a switching signal such that said data read in parallel from said memory cell array in each read cycle is held by said latch circuit at a timing of an external input signal, and said data held by said latch circuit is divided by a plural number, one group of the divided data being outputted to said plurality of data output terminals in said read cycle and the remaining group of data being outputted to said plurality of data output terminals in a predetermined period of the next read cycle.

12. The semiconductor memory device according to claim 11, wherein said external input signal is used as said switching signal.

13. The semiconductor device according to claim 11, wherein said output control circuit is switched to the first mode during a test operation.

14. The semiconductor device according to claim 13, wherein said predetermined period of the first mode is a period of invalid data outputs during a normal operation.

15. A semiconductor memory device, comprising:
    a memory cell array;
    a plurality of data output terminals for outputting data of a plurality of bits in parallel;

a latch circuit arranged between said memory cell array and said plurality of data output terminals;

a read control circuit for reading data of bits in parallel from said memory cell array, the number of said bits being a plurality of times as large as the number of said plurality of data output terminals; and an output control circuit for performing a switching control of a first mode on the basis of a switching signal such that said data read in parallel from said memory cell array in each read cycle is held by said latch circuit at a timing of an external input signal, and said data held by said latch circuit is divided by a plural number, the divided groups of data being outputted group by group to said plural data output terminals in the next read cycle.

16. The semiconductor memory device according to claim 15, wherein said external input signal is used as said switching signal.

17. The semiconductor device according to claim 15, wherein said output control circuit is switched to the first mode during a test operation.

18. The semiconductor device according to claim 17, wherein a period of an invalid data outputs during a normal operation is included in the next read cycle.

19. A semiconductor memory device, comprising:

a memory cell array;

a plurality of data output terminals for outputting data of a plurality of bits in parallel;

a latch circuit arranged between said memory cell array and said plurality of data output terminals;

a read control circuit for reading data of bits in parallel from said memory cell array, the number of said bits being a plurality of times as large as the number of said plurality of data output terminals; and an output control circuit for performing a switching control on the basis of a switching signal such that the data read in parallel from said memory cell array in each read cycle is held by said latch circuit at a timing of an external input signal, and said data held by said latch circuit is divided by a plural number, during a normal operation one group of the divided data being outputted to said plurality of data output terminals in said cycle and the remaining group of data being outputted to said plurality of data output terminals in the next read cycle, and during a test operation the divided groups of data being outputted group by group to said plurality of data output terminals in the next read cycle including a period of invalid data outputs during said normal operation.

20. The semiconductor memory device according to claim 19, wherein said external input signal is used as said switching signal.

21. A semiconductor memory device, comprising:

a memory cell array;

a plurality of data output terminals for outputting data of a plurality of bits in parallel;

a latch circuit arranged between said memory cell array and said plurality of data output terminals;

a read control circuit for reading data of bits in parallel from said memory cell array, the number of said bits being a plurality of times as large as the number of said plurality of data output terminals; and an output control circuit for performing a switching control of a first mode on the basis of an external input signal such that the data read in parallel from said memory cell array in each read cycle is held by said latch circuit, and the data held by said latch circuit is divided by a plural number, one group of the divided data being outputted to said plurality of data output terminals in said read cycle and the remaining group of data being outputted to said plurality of data output terminals in a predetermined period of the next read cycle.

22. The semiconductor device according to claim 21, wherein said output control circuit is switched to the first mode during a test operation.

23. The semiconductor device according to claim 22, wherein predetermined period of the first mode is a period of invalid data outputs during a normal operation.

24. A semiconductor memory device, comprising:

a memory cell array;

a plurality of data output terminals for outputting data of a plurality of bits in parallel;

a latch circuit arranged between said memory cell array and said plurality of data output terminals;

a read control circuit for reading data of bits in parallel from said memory cell array, the number of said bits being a plurality of times as large as the number of said plurality of data output terminals; and an output control circuit for performing a switching control of a first mode on the basis of an external input signal such that the data read in parallel from said memory cell array in each read cycle is held by said latch circuit, and said data held by said latch circuit is divided by a plural number, the divided groups of data being outputted group by group to said plurality of data output terminals in the next read cycle.

25. The semiconductor device according to claim 24, wherein said output control circuit is switched to the first mode during a test operation.

26. The semiconductor device according to claim 25, wherein a period of invalid data outputs during a normal operation is included in the next read cycle of the first mode.

27. A semiconductor memory device, comprising:

a memory cell array;

a plurality of data output terminals for outputting data of a plurality of bits in parallel;

a latch circuit arranged between said memory cell array and said plurality of data output terminals;

a read control circuit for reading data of bits in parallel from said memory cell array, the number of said bits being a plurality of times as large as the number of said plurality of data output terminals; and an output control circuit for performing a switching control on the basis of an external input signal such that said data read in parallel from said memory cell array in each read cycle is held by said latch circuit, and said data held by said latch circuit is divided by a plural number, during a normal operation one group of the divided data being outputted to said plurality of data output terminals in said read cycle and the remaining group of data being outputted to said plurality of data output terminals in the next read cycle, and during a test operation the divided groups of data being outputted group by group to said plurality of data output terminals in a period of the next read cycle including a period of invalid data outputs during said normal operation.

28. A method for testing a semiconductor memory device wherein data is stored in a memory cell array, read in parallel during each read cycle and outputted, said method comprising:

holding the data read from the memory cell array, wherein the number of bits of the data read from memory cell array is greater than the number of bits of the outputted data;

dividing the held data by a number greater than one; and performing switching control such that one group of the divided data is outputted during the read cycle, and the remaining group is outputted during a next read cycle.

29. In a semiconductor memory device wherein a memory cell array, and a read control circuit are disposed such that data stored in said memory cell array is read in parallel during each read cycle and then outputted, wherein the improvement comprises:

holding means for holding the read data, wherein the number of bits of read data is greater than the number of bits of the outputted data;

dividing means for dividing the held data; and switching circuit control means for switching and outputting data such that one group of the divided data is outputted during said read cycle and the remaining group is outputted during a next read cycle.

30. In a semiconductor memory device wherein a memory cell array, and a read control circuit are disposed such that data stored in said memory cell array is read in parallel during each read cycle and then outputted, the read control circuit comprising:

holding means for holding the read data;

dividing means for dividing the held data; and switching means for switching and outputting data.

31. The device according to claim 30, wherein one group of the divided data is outputted during the read cycle and the remaining group of divided data is outputted during a predetermined period of the next read cycle.

32. The device according to claim 31, wherein the predetermined period is the initial period of the next read cycle.

33. The device according to claims 29 or 30, further comprising an address transition detecting means for detecting an address signal to output a latch control signal and wherein:

the holding means is a latch circuit and the held data is divided by an integer;

said data held by said latch circuit triggered by said latch control signal; and said switching is controlled by a switching signal.

34. The device according to claims 1, 5, 9, 11, 15, 19, 21, 24, 27, 29 or 30, wherein said memory device is a read only memory.

* * * * *